United States Patent
Van Os et al.

(10) Patent No.: US 9,474,151 B2
(45) Date of Patent: Oct. 18, 2016

(54) ELECTRONIC TEXTILE WITH MEANS FOR FACILITATING WASTE SORTING

(71) Applicant: KONINKLIJKE PHILIPS N.V., Eindhoven (NL)

(72) Inventors: Jacobus Petrus Johannes Van Os, Eindhoven (NL); Steven Broeils Luitjens, Eindhoven (NL); Liesbeth Van Pieterson, Eindhoven (NL); Guofu Zhou, Eindhoven (NL); Frank Anton Van Abeelen, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 89 days.

(21) Appl. No.: 14/362,730

(22) PCT Filed: Nov. 27, 2012

(86) PCT No.: PCT/IB2012/056754
§ 371 (c)(1),
(2) Date: Jun. 4, 2014

(87) PCT Pub. No.: WO2013/084108
PCT Pub. Date: Jun. 13, 2013

(65) Prior Publication Data
US 2014/0334113 A1 Nov. 13, 2014

Related U.S. Application Data

(60) Provisional application No. 61/567,965, filed on Dec. 7, 2011.

(51) Int. Cl.
*H05K 1/03* (2006.01)
*H05K 3/22* (2006.01)
(Continued)

(52) U.S. Cl.
CPC ............ *H05K 1/038* (2013.01); *H05K 1/0393* (2013.01); *H05K 1/111* (2013.01); *H05K 3/22* (2013.01);
(Continued)

(58) Field of Classification Search
CPC .... H05K 1/038; H05K 1/111; H05K 1/0393; H05K 3/22; H05K 3/20; H05K 1/189; H05K 2203/178; B32B 3/08; B32B 5/02; B32B 7/04; B32B 5/06; Y02P 70/613; Y02P 70/611; Y10T 29/49117
USPC ......................................... 428/196, 198, 188
See application file for complete search history.

(56) References Cited

U.S. PATENT DOCUMENTS 4,070,217 A * 1/1978 Smith et al. ................. 156/73.2
4,774,434 A 9/1988 Bennion
(Continued)

FOREIGN PATENT DOCUMENTS

DE  102005033643 A1  2/2007
DE  102006027213 A1  12/2007
(Continued)

OTHER PUBLICATIONS

Jones, I.A. et al "Novel Joining Methods Applicable to Textiles and Smart Garments", TWI, Sep. 2005, pp. 1-10.
(Continued)

*Primary Examiner* — Elizabeth M Cole

(57) ABSTRACT

According to the present invention, an electronic textile (1) is provided. The electronic textile comprises an electronic structure (3) including conductive wires (4) being at least partly spaced apart from each other and one or more electronic components (5) connected to the conductive wires. One or more gaps (14) are formed in the electronic structure between the at least partly spaced apart conductive wires. The electronic textile further comprises a fabric structure (2) including two fabric portions (10), wherein the electronic structure is sandwiched between the two fabric portions. Further, the two fabric portions are joined together according to a bonding pattern including bonding segments (8), the bonding segments being arranged in one or more of the gaps of the electronic structure such that the electronic structure is held in place in the fabric structure by the bonding pattern. With the present invention, the separation of the electronics from the fabric is made easier, which is advantageous in that waste sorting of the electronic textile is facilitated.

14 Claims, 3 Drawing Sheets

(51) Int. Cl.
*H05K 1/11* (2006.01)
*H05K 1/18* (2006.01)
*H05K 3/20* (2006.01)

(52) U.S. Cl.
CPC ............... *H05K 1/189* (2013.01); *H05K 3/20* (2013.01); *H05K 2203/178* (2013.01); *Y02P 70/611* (2015.11); *Y02P 70/613* (2015.11); *Y10T 29/49117* (2015.01)

(56) References Cited

U.S. PATENT DOCUMENTS

| | | | |
|---|---|---|---|
| 6,210,771 | B1 * | 4/2001 | Post et al. ............ 428/100 |
| 6,493,933 | B1 | 12/2002 | Post |
| 6,729,025 | B2 | 5/2004 | Farrell |
| 6,880,955 | B2 | 4/2005 | Lin |
| 2001/0001300 | A1 | 5/2001 | Tolbert |
| 2002/0076948 | A1 | 6/2002 | Farrell |
| 2002/0125025 | A1 | 9/2002 | Svarfvar |
| 2007/0215232 | A1 | 9/2007 | Hassonjee |
| 2011/0036448 | A1 | 2/2011 | Van Pieterson |

FOREIGN PATENT DOCUMENTS

| | | | |
|---|---|---|---|
| EP | 0525217 | A1 | 2/1993 |
| WO | WO 2005123378 | A1 * | 12/2005 |
| WO | 2006128957 | A1 | 12/2006 |

OTHER PUBLICATIONS

Chen, Fang-Chung et al "Reconfigurable Fabric: An Enabling Technology for Pervasive Medical Monitoring", National Science Foundation , 2008.

Koehler, Andreas R. End of Life Implications of Electronics Textiles, Assessment of a Converging Technology, IIIEE Theses 2008.

* cited by examiner

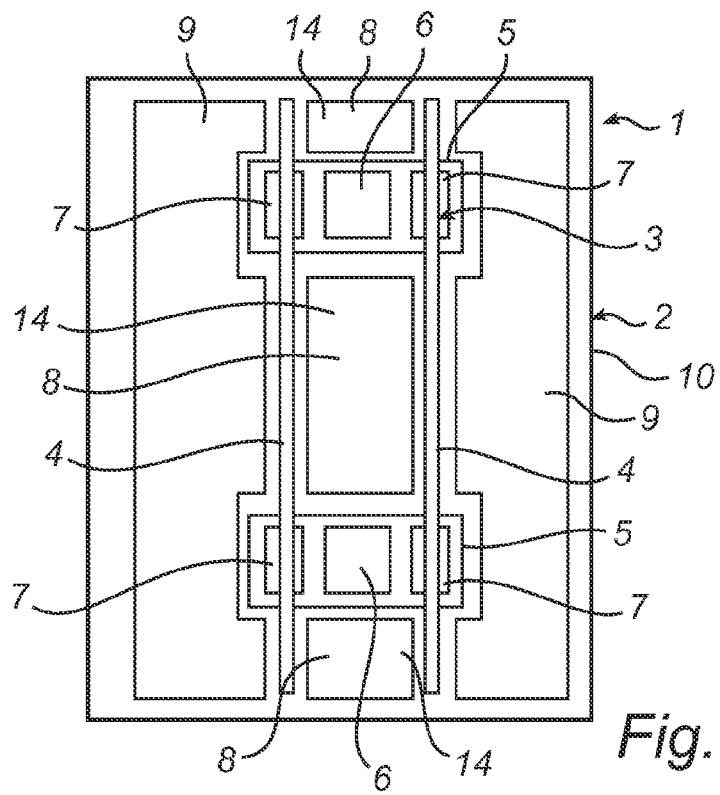
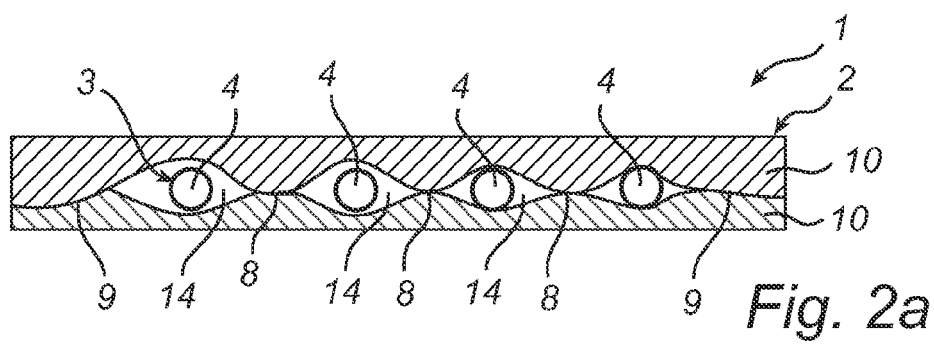
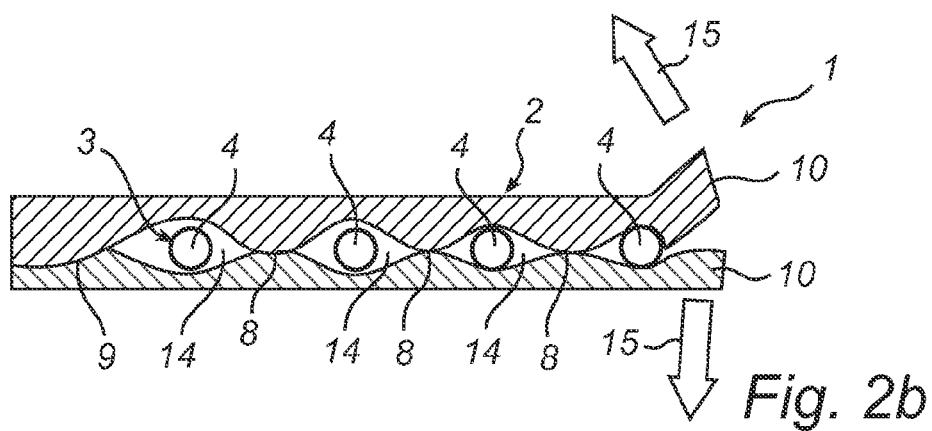

ELECTRONIC TEXTILE WITH MEANS FOR FACILITATING WASTE SORTING

FIELD OF THE INVENTION

The present invention generally relates to the field of electronic textiles comprising conductive wires and electronic components and a method of manufacturing such an electronic textile.

BACKGROUND OF THE INVENTION

Electronic textiles are textiles with electronics integrated in the fabric. Normally, electronic textiles comprises conductive wires weaved as warp and/or weft yarns into a fabric and electronic components connected to the conductive wires. With electronic textiles, new application fields emerge, wherein the benefits of textile are combined with electronic functions. However, the integration of electronics in the fabric makes handling of an electronic textile throughout its life cycle different from handling of conventional textiles with respect to a number of different aspects concerning everything from manufacturing to end of product life issues.

A textile is described in U.S. Pat. No. 6,729,025. The textile comprises a flex circuit formed by a flexible substrate with electronically conductive traces and electronic components on it. The flex circuit is secured to a fabric by welding, adhesive or sewing, whereby the need of conductive fibers in the fabric is eliminated. A drawback with such a textile is that there, on one hand, is a risk of the flex circuit to come loose from the fabric due to wear and tear, and on the other hand, it may be cumbersome to remove the flex circuit from the fabric if the textile shall be waste sorted at the end of its life.

SUMMARY OF THE INVENTION

It is an object of the present invention to overcome the above problems, and to provide an improved electronic textile and a method of manufacturing such an electronic textile. It is also an object of the present invention to provide an electronic textile which facilitates waste sorting.

These and other objects are achieved by means of an electronic textile and a method of manufacturing such an electronic textile having the features set forth in the independent claims. Embodiments of the invention are defined in the dependent claims.

According to a first aspect of the present invention, an electronic textile is provided. The electronic textile comprises an electronic structure including conductive wires being at least partly spaced apart from each other and one or more electronic components connected to the conductive wires. One or more gaps are formed in the electronic structure between the at least partly spaced apart conductive wires. The electronic textile further comprises a fabric structure including two fabric portions, wherein the electronic structure is sandwiched between the two fabric portions. Further, the two fabric portions are joined together according to a bonding pattern including bonding segments (or bonds), the bonding segments being arranged in one or more of the gaps of the electronic structure such that the electronic structure is held in place in the fabric structure by the bonding pattern.

According to a second aspect of the present invention, a method of manufacturing an electronic textile is provided. The method comprises the step of providing an electronic structure including conductive wires being at least partly spaced apart from each other and one or more electronic components connected to the conductive wires, wherein one or more gaps are formed in the electronic structure between the at least partly spaced apart conductive wires. The method further comprises the steps of providing a fabric structure including two fabric portions and sandwiching the electronic structure between the two fabric portions. Further, the two fabric portions are joined together according to a bonding pattern including bonding segments, such that the bonding segments are arranged in one or more of the gaps of the electronic structure, whereby the electronic structure is held in place in the fabric structure by the bonding pattern.

The inventors have realized that it is desirable to adapt new electronic textiles to environmental demands and that the integration of textile and electronic rises new issues when it comes to waste sorting and recycling. When coming to the end of the life of an electronic textile product, the problem of how to handle the waste appears, as it may be handled both as electronic waste and textile waste. In the known techniques described above, wherein the conductive wires are weaved into the fabric as warp and/or weft yarns, or wherein circuit boards are secured to the fabric e.g. by adhesion, it is rather cumbersome to separate the electronics from the fabric for separate recycling of the electronic residue and the textile residue.

The present invention is based on the idea of having separate electronic and fabric structures in the electronic textile. As the electronic structure is secured in the fabric structure by the bonding pattern with bond segments in the gaps of the electronic structure, the need of further attachment of the electronic structure to the fabric structure is reduced, whereby the separation of the electronics from the fabric is made easier, which is advantageous in that waste sorting of the electronic textile is facilitated. After separation, the fabric structure may be handled as textile waste and recycled into new textile material, and the electronic structure may be handled as electronic waste or, if still working, even be re-used in a new electronic textile.

In various embodiments of the invention, the fabric structure with its bonding pattern may provide a stable and protective mechanical structure, as well as electrical insulation, for the electronics, thereby improving the robustness of the electronic textile. Further, as the electronic structure is covered by the fabric structure, the electronics are better protected from wear and tear as compared to the known techniques described above. Further, enclosing of the electronic structure in the fabric structure provides a more esthetic appearance of the electronic textile as the electronic components and the conductive wires are less visible. The fabric structure may also provide a diffuser if light emitting components such as light emitting diodes, LEDs, are comprised in the electronic structure.

The present invention is also advantageous in that the electronic structure may cover a relatively large area while still providing a flexible electronic textile, which may be more comfortable to wear.

In the present disclosure, the term "gap" may refer to a (through) hole in the electronic structure, in which hole the two fabric portions are allowed to be brought together for obtaining a bonding segment.

According to an embodiment of the present invention, a bonding strength of the bonding segments may be weaker than a tear strength of the fabric portions. The fabric portions may then be pulled apart such that the bonds of the bonding pattern separates, without the fabric necessarily breaking. When the fabric portions are separated, the electronic structure can be removed from the fabric structure. The present embodiment is advantageous in that separation of the electronics from the fabric is further facilitated as the two fabric portions simply may be pulled apart to release the electronic structure. The need of equipment, such as scissors, for opening the fabric structure is reduced.

The tear strength is a characteristic feature of a fabric and may be measured in a textile laboratory in a standard procedure. The tear strength is the force necessary to tear a fabric, e.g. measured by the force necessary to start or continue a tear in a fabric. The tear strength of a fabric may depend on the tearing direction, e.g. if the warp and weft yarns have different durability. With the present embodiment, the bonding strength of the bonding segments may be weaker than the tear strength in any tear direction of the fabric portions, and preferably, weaker than the lowest (or weakest) tear strength of the fabric portions (i.e. weaker than the tear strength in the tear direction which has the lowest tear strength).

According to an embodiment of the present invention, the fabric portions may be joined together by welding, such as ultrasonic welding. The bonding segments of the bonding pattern may then form welding segments (or welding spots) by which the two fabric portions are joined together. The present embodiment is advantageous in that the weld can be adjusted to have an appropriate robustness to withstand wear and tear during usage of the electronic textile and to allow intentional separation of the fabric portions, e.g. by tearing them apart, when recycling the electronic textile. Further, welding does not require any additional medium for connecting the fabric portions, thereby making the fabric structure purer for further recycling.

In the present disclosure, with the term "purer" it is meant that an element or component comprises less different materials categories, thereby enabling an enhanced and facilitated recycling. For example, if an element comprises merely one material category, it may directly be recycled, but if it comprises two different materials categories, such as metal and plastic, these two materials may have to be separated before further recycling of the materials. Hence, from a recycling point of view, purer elements and components are preferable.

Welding may be performed by applying heat and/or pressure at the fabric portions such that they are fused together. Preferably, the segments of the fabric portions to be bonded may comprise a polymer which is capable of slightly melting during the welding procedure. For example, the fabric portions may comprise a synthetic fabric such as polyester, and/or a coating comprising a polymer. However, it will be appreciated that the fabric portions may comprise any weldable material.

In an alternative embodiment, the fabric portions may be joined together by sewing, adhesion or any other appropriate fabric joining method.

According to an embodiment of the present invention, the conductive wires and the electronic components may be arranged in the fabric structure in one or more recesses (or pockets) formed by the two fabric portions between the bonding segments. The shape and spreading of the recesses may be defined by the bonding pattern. Further, the size and shape of the recesses may preferably be adapted to match the size and shape of the conductive wires and the electronic components, thereby providing a firmer securing of the electronic structure in the fabric structure.

In an embodiment of the present invention, the conductive wires and/or the electronic components may be detached (or non-connected) from the fabric portions. Hence, the conductive wires and/or the electronic components may merely be held in place in the fabric structure by the bonding pattern, without any further attaching means. In the present disclosure, the term "detached" means that the conductive wires and/or the electronic components may be arranged in the fabric structure adjacent to, but not adhered, sewn or permanently attached to the fabric portions.

The present embodiment is advantageous in that it further facilitates separation of the electronic structure from the fabric structure and leaves the electronics and the fabric purer after separation for further recycling since no adhesive medium may be applied to the electronic structure.

In an alternative embodiment, the electronic structure may be adhered or sewn onto one or both of the fabric portions, but preferably just at a few spots for still allowing facilitated separation of the electronics and the fabric.

According to an embodiment of the present invention, the bonding segments may electrically insulate the conductive wires and/or the electronic components from neighboring conductive wires and/or electronic components, which is advantageous in that it reduces the risk of short circuits and the need of additional insulating material, such as plastic, covering the electronic structure. Hence, the electronic structure may be purer, i.e. comprise mostly electronic material for facilitating further recycling.

According to embodiments of the present invention, the bonding pattern may further include a bonding segment outside the periphery of the electronic structure, such that the electronic structure may be more completely enclosed in the fabric structure. Further, a bonding strength of the bonding segment outside the periphery of the electronic structure may be stronger than a bonding strength of the bonding segments arranged in the gaps of the electronic structure, which is advantageous in that it increases the robustness of the electronic textile while still facilitating separation of the electronics from the fabric. In yet an embodiment, a bonding strength of the bonding segment outside the periphery of the electronic structure is stronger than a tear strength of the fabric portions, which is advantageous in that it further increases the robustness of the electronic textile.

With each one of the present embodiments, the preferably more firm bonding segment outside the periphery of the electronic structure may reduce the risk of the fabric portions being ripped apart during usage of the electronic textile. This bonding segment, in particular if being stronger than the tear strength of the fabric portions, may then be cut away, e.g. with the use of scissors, when the electronic structure and the fabric structure shall be separated. The bonding segment (or joining of the fabric portions) outside the periphery of the electronic structure may e.g. be obtained by welding, gluing or sewing, and/or simply by the two fabric portions being formed of a single piece of fabric being folded to cover both sides of the electronic structure.

It will be appreciated that the bonding pattern may include more than one bonding segment outside the periphery of the electronic structure.

According to an embodiment of the present invention, the electronic structure may include one or more spaced apart pairs of conductive wires, wherein the conductive wires within each pair may be at least partly spaced apart from each other. Each one of the electronic components may be connected to one of the pairs of conductive wires. Further, the bonding segments (of the bonding pattern) may be arranged in gaps of the electronic structure formed between the at least partly spaced apart conductive wires within each pair and in gaps of the electronic structure formed between the pairs of conductive wires. The present embodiment is advantageous in that the conductive wires in each pair may be electrically insulated from each other by the bonding segments, thereby reducing the need of coating the conductive wires with insulating coating.

According to an embodiment of the present invention, the electronic structure may comprise a counter component configured to store the number of re-uses of the electronic structure, which is advantageous in that the electronic structure itself can keep track of how many times it has been re-used. When the life of the electronic textile comes to an end, e.g. because of the fabric being too worn or if an electronic component is damaged, the electronic structure may be separated from the fabric structure to be repaired if required, and re-used in a new electronic textile.

According to an embodiment of the present invention, the conductive wires may be bare wires, which is advantageous in that they are purer for further recycling. The bare wires may be electrically insulated from neighboring bare wires and electronic components by the bonding segments.

In the following, further embodiments, in particular referring to the second aspect of the invention, will be described.

According to an embodiment of the invention, in the method of manufacturing the electronic textile, the step of joining the fabric portions together may be made by welding, which is advantageous in that welding can be rather accurately performed with a reduced risk of touching the electronics during the joining process.

According to embodiments of the present invention, the method may further comprise the step of arranging the conductive wires in a frame, and preferably the step of cutting the conductive wires out of the frame subsequent to the step of joining the fabric portions together. The electronic structure may be fixed in the frame during joining of the fabric portions, thereby holding the conductive wires and electronic components in position during the joining operation, which is advantageous in that the joining operation can be performed more accurately and the fabric portions may be bonded closer to the conductive wires and the electronic components.

It is noted that the invention relates to all possible combinations of features recited in the claims. Further, it will be appreciated that the various embodiments described for the electronic textile are all combinable with the method as defined in accordance with the second aspect of the present invention.

BRIEF DESCRIPTION OF THE DRAWINGS

This and other aspects of the present invention will now be described in more detail, with reference to the appended drawings showing embodiments of the invention.

FIG. 1 shows an electronic textile according to an embodiment of the present invention, FIG. 2A is a cross-section view of an electronic textile according to an embodiment of the present invention, FIG. 2B shows the electronic textile of FIG. 2A, but when two fabric portions are torn apart.

Figure 3A:
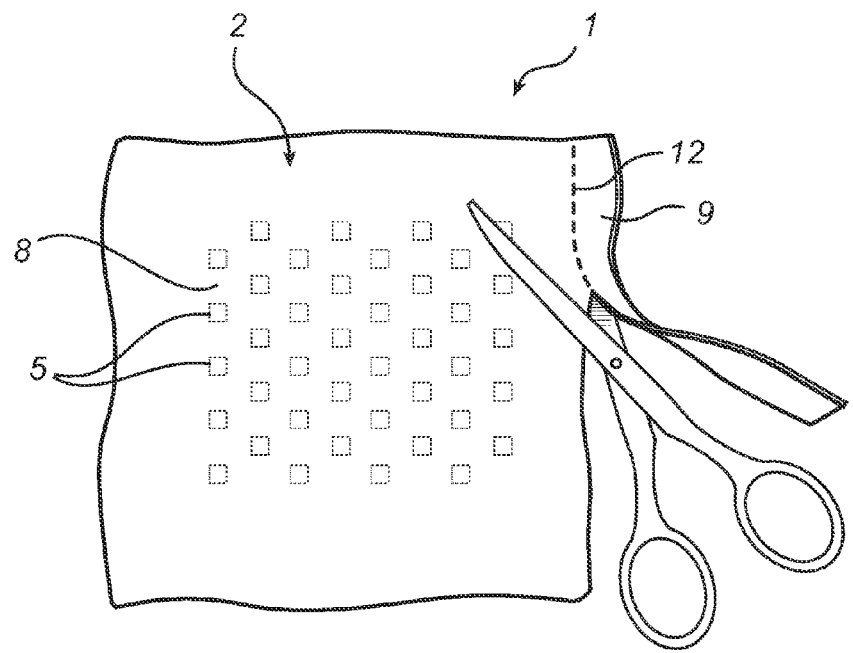
FIG. 3A shows an electronic textile according to an embodiment of the present invention, when a bonding segment outside the periphery of an electronic structure is cut away.

All the figures are schematic, not necessarily to scale, and generally only show parts which are necessary in order to elucidate the invention, wherein other parts may be omitted or merely suggested.

DETAILED DESCRIPTION OF THE EMBODIMENTS

An electronic textile according to an embodiment of the present invention will be described with reference to FIG. 1.

FIG. 1 shows an electronic textile 1 comprising an electronic structure 3 including a pair of conductive wires 4 being spaced apart from each other. Electronic components 5 are connected to the conductive wires 4 by soldering spots 7. The electronic components 5 may comprise any kind of appropriate components, such as LEDs 6 (as shown in FIG. 1), organic LEDs (OLEDs), sensors, processors, displays etc. Between the spaced apart conductive wires 4, gaps 14 are formed in the electronic structure 3. As illustrated in FIG. 1, the gaps (or holes) 14 may be defined not only by the conductors 4, but also by the electronic components 5.

The electronic textile 1 may comprise a plurality of spaced apart conductive wires 4, such as a plurality of spaced apart pairs of spaced apart conductive wires 4 (not shown in FIG. 1), wherein gaps 14 may be formed between the spaced apart conductive wires 4 of each pair and between each spaced apart pair of conductive wires 4.

The electronic textile 1 further comprises a fabric structure 2 comprising two fabric portions 10 between which the electronic structure 3 is sandwiched. For the sake of clarity, merely one fabric portion 10 is shown in FIG. 1 for making the electronic structure 3 visible. The fabric portions 10 are arranged to cover opposite sides of the electronic structure 3, thereby substantially enclosing and protecting the electronic structure 3. The fabric portions 10 may be formed by a single piece of fabric folded such that it covers the opposite sides of the electronic structure 3. Alternatively, the fabric portions 10 may be formed by two separate pieces of fabric.

For holding the electronic structure 3 in place in the fabric structure 2, the fabric portions 10 are joined together according to a bonding pattern formed by bonding segments 8, 9. Some of the bonding segments 8 are arranged in the gaps 14 between the conductive wires 4, and some bonding segments 9, hereinafter referred to as outer bonding segments 9, are preferably arranged outside the periphery of the electronic structure 3. In other words, the fabric portions 10 are joined together between the conductive wires 4 and the electronic components 5. Recesses are defined in the fabric structure 2 between the bonding segments 8, 9, in which recesses the conductive wires 4 and the electronic components 5 are arranged. The arrangement of the bonding pattern secures the electronic structure 3 in the fabric structure 2 and reduces the possible relative movement between the electronic structure 3 and the fabric structure 2. Preferably, the bonding segments 8, 9 may be made as large as possible to fill out as much of the gaps 14 as possible, which in turn will make the recesses between the bonding segments 8, 9 as narrow (or small) as possible. The tight fit of the electronic structure 3 in the recesses between the bonding segments 8, 9 will reduce the possible relative movement between the electronic structure 3 and the fabric structure 2 even more.

The bonding segments 8 provided in the gaps 14 in the electronic structure 3, physically separate and electrically insulate the conducting wires 4 and the electronic components 5 from each other, thereby reducing the need of further insulating material in the electronic structure.

The joining of the two fabric portions 10 may preferably be obtained by welding. Alternatively, one side of at least one of the two fabric portions 10 may be coated with an adhesive such that the two fabric portions 10 may stick to each other with the electronic structure 3 in between.

An electronic textile 1 according to an embodiment of the present invention will now be described with reference to FIGS. 2A and 2B.

FIGS. 2A and 2B are cross-sectional views of an electronic textile 1 comprising an electronic structure 3 with a plurality of conductive wires 4 and a fabric structure 2 comprising two fabric portions 10. The two fabric portions 10 are joined together according to a bonding pattern with bonding segments 8 arranged in gaps 14 between the conductive wires 4 and outer bonding segments 9 arranged outside the periphery of the electronic structure 3, i.e. on the outside of the outer conductive wires 4. Preferably, the bonding strength of the outer bonding segments 9 is stronger (more firm) than the bonding segments 8 in the gaps 14. In particular, the bonding strength of the outer bonding segments 9 may be stronger than the tear strength of the fabric portions 10. The firmer outer bonding segments 9 are preferably adapted to withstand separating forces applied to the fabric portions during usage of the electronic textile 1, thereby reducing the risk of unintended separation of the fabric portions 10. FIG. 2A shows the electronic textile 1 when the outer bonding segments 9 are sealed, wherein the electronic textile 1 is in a state suitable for usage.

Further, the bonding strength of the bonding segments 8 in the gaps 14 between the conductive wires 4 may preferably be weaker than the tear strength of the fabric portions 10 such that the two fabric portions 10, preferably after removal of the outer bonding segments 9, may be torn apart for opening up the fabric structure 2. FIG. 2B shows the electronic textile 1 when one of the bonding segments 9 is removed (such as cut away) and separating forces, indicated by arrows 15, are applied to the fabric portions 10. When the separating forces are stronger than the bonding strength of the bonding segments 8 in the gaps of the electronic structure 3, the bonds of the bonding segments 8 will split such that the fabric portions 10 are separated by the separating forces.

Figure 3B:
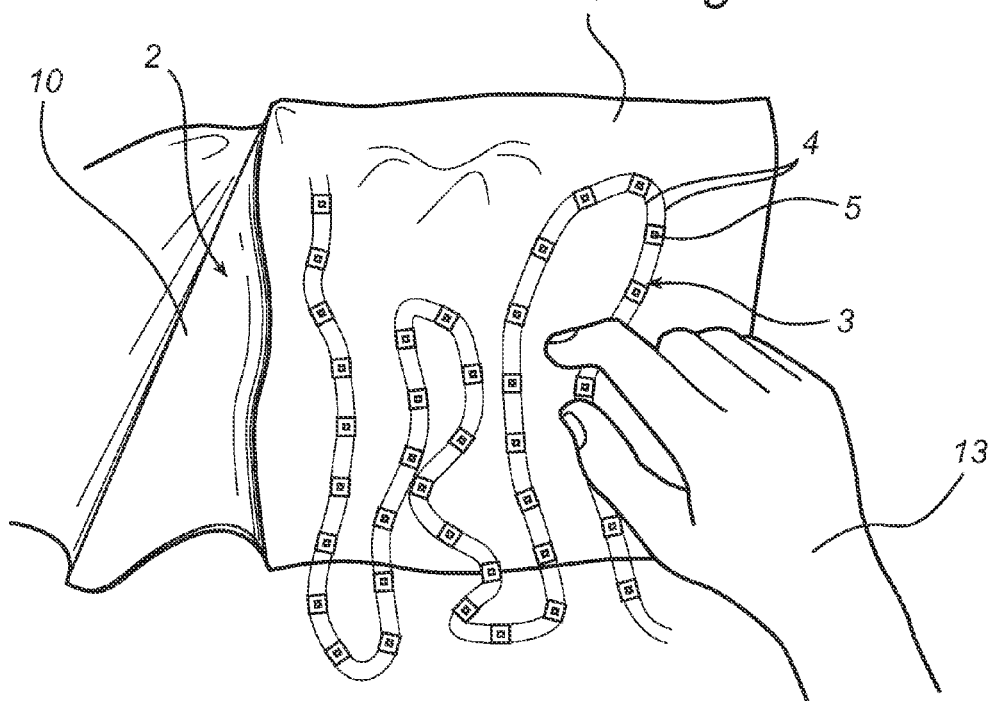
FIG. 3B shows the electronic textile of FIG. 3A, but when two fabric portions are separated and an electronic structure is removed.

With reference to FIGS. 3A and 3B, an example of how to separate the electronic structure 3 and the fabric structure 2 of the electronic textile will be described.

When it is desirable to separate the electronic structure 3 from the fabric structure 2 of the electronic textile 1 (e.g. during waste sorting), at least one firm outer bonding 9 is cut away, as shown in FIG. 3A. To facilitate finding the right place to cut, a cutting mark 12 may be provided in the electronic textile 1. At this stage, the fabric portions 10 are still held together by the bonding segments 8 of the bonding pattern at the gaps between the conductive wires 4. Subsequently, the fabric portions 10 are separated (or torn apart), e.g. by hand, whereby the bonding segments 8 separate and the fabric structure 2 opens up. The electronic structure 3, including the conductive wires 4 and the electronic components 5, may then rather easily be removed from the fabric structure 2, as illustrated by the hand 13 in FIG. 3B. Subsequently, the fabric structure 2 may be further recycled as fabric waste and the electronic structure 3 as electronic waste. Alternatively, the electronic structure 3 may be re-used in a new electronic textile.

Figure 4A:
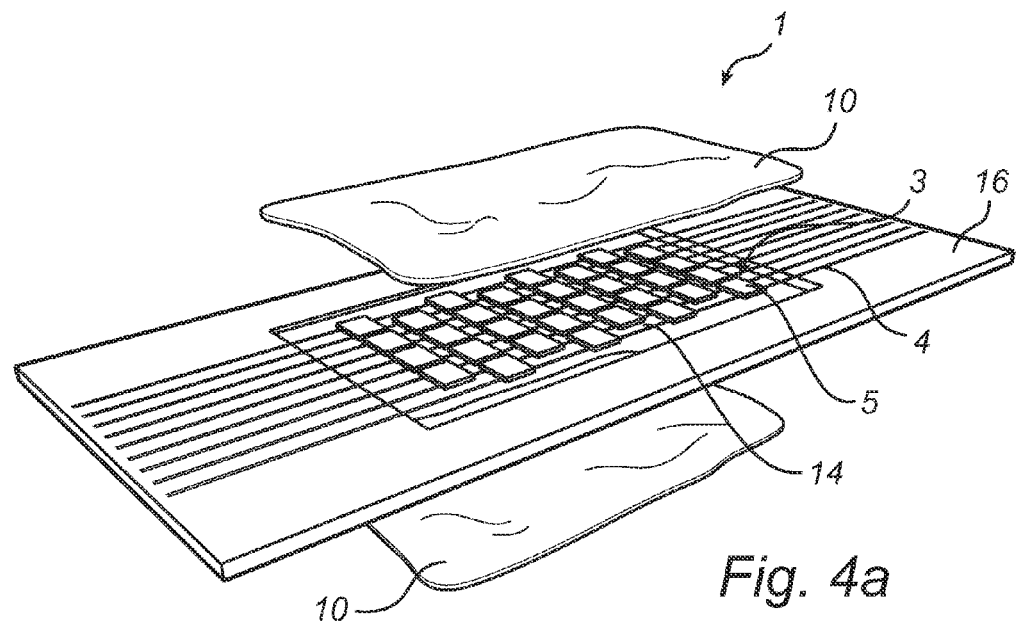
FIGS. 4A and 4B illustrate an electronic textile being manufactured in accordance with a method according to an embodiment of the present invention.
Figure 4B:
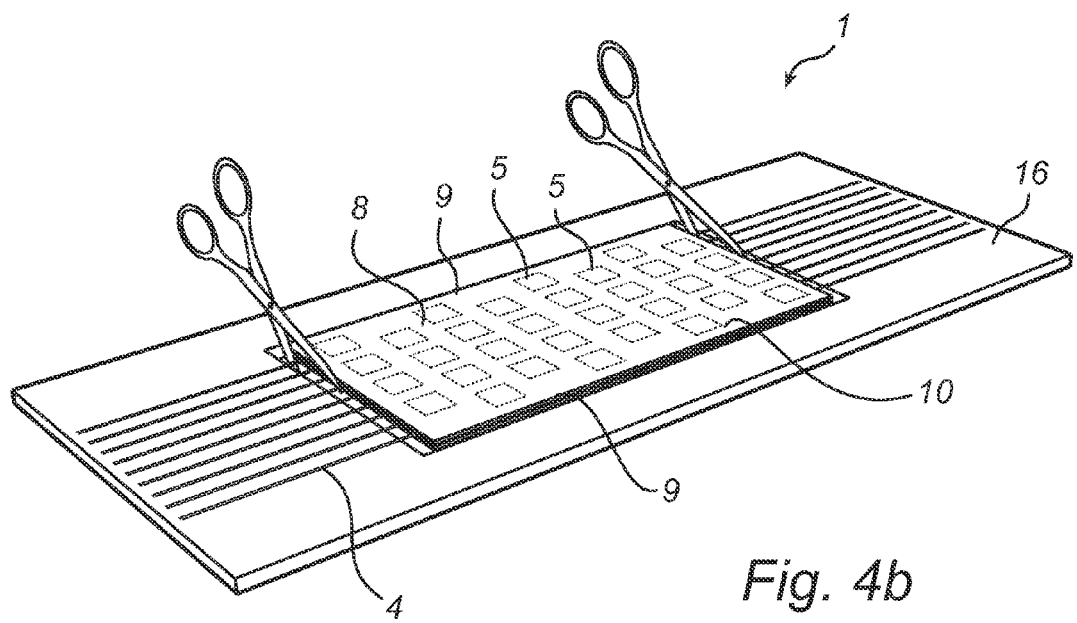

With reference to FIGS. 4A and 4B, an example of a method of manufacturing an electronic textile according to an embodiment of the present invention will be described.

First, the conductive wires 4 may be mounted into a frame 16 such that they are appropriately positioned for the subsequent manufacturing steps. The electronic components 5 may then be mounted to the conductive wires 4, e.g. by soldering. Together, the conductive wires 4 and the electronic components 5 now form the electronic structure 3, and gaps 14 are formed between the conductive wires 4 and the electronic components 5. For the sake of simplicity, merely one gap 14 is denoted with reference sign 14 in FIG. 4A, but a plurality of gaps 14 are however formed in the electronic structure 3 between the conductive wires 4 and electronic components 5.

The next step is to provide two fabric portions 10 for forming a fabric structure. The fabric portions 10 are laminated together, preferably by welding, according to a bonding pattern including bonding segments 8, 9, as shown in FIG. 4B. The fabric portions 10 are welded together in the gaps 14 in the electronic structure 3 and outside the periphery of the electronic structure 3. Finally, the electronic textile 1 is released from the frame 16 by cutting out the conductive wires 4 which are attached to the frame 16.

The person skilled in the art realizes that the present invention by no means is limited to the preferred embodiments described above. On the contrary, many modifications and variations are possible within the scope of the appended claims. For example, the conductive wires may not just be arranged in parallel to each other as shown in the drawings, but also cross-wise or in any appropriate way such that gaps are provided in the electronic structure. Further, the electronic structure and/or the fabric structure may be provided with a water resistant coating or cover to make the electronic textile less sensitive to moisture.

The invention claimed is:

1. An electronic textile comprising:
   an electronic structure including conductive wires being at least partly spaced apart from each other and one or more electronic components connected to the conductive wires, wherein one or more gaps are formed in the electronic structure between the at least partly spaced apart conductive wires, and
   a fabric structure including two fabric portions,
   wherein the electronic structure is between the two fabric portions, and
   wherein the two fabric portions are joined together according to a bonding pattern including bonding segments, the bonding segments being arranged in one or more of the gaps of the electronic structure such that the electronic structure is held in place in the fabric structure by the bonding pattern, wherein a bonding strength of the bonding segments is weaker than a tear strength of the fabric portions.

2. An electronic textile as defined in claim 1, wherein the fabric portions are joined together by welding.

3. An electronic textile as defined in claim 1, wherein the conductive wires and the electronic components are arranged in the fabric structure in one or more recesses formed by the two fabric portions between the bonding segments.

4. An electronic textile as defined in claim 1, wherein the conductive wires and/or the electronic components are detached from the fabric portions.

5. An electronic textile as defined in claim 1, wherein the bonding segments electrically insulate the conductive wires and/or the electronic components from neighboring conductive wires and/or electronic components.

6. An electronic textile as defined in claim 1, wherein the bonding pattern further includes a bonding segment outside the periphery of the electronic structure.

7. An electronic textile as defined in claim 6, wherein a bonding strength of the bonding segment outside the periphery of the electronic structure is stronger than a bonding strength of the bonding segments arranged in the gaps of the electronic structure.

8. An electronic textile as defined in claim 6, wherein a bonding strength of the bonding segment outside the periphery of the electronic structure is stronger than a tear strength of the fabric portions.

9. An electronic textile as defined in claim 1, wherein the electronic structure includes one or more spaced apart pairs of conductive wires, wherein the conductive wires within each pair are at least partly spaced apart from each other, wherein each one of the electronic components is connected to one of the pairs of conductive wires, and wherein the bonding segments are arranged in gaps of the electronic structure formed between the at least partly spaced apart conductive wires within each pair and in gaps of the electronic structure formed between the pairs of conductive wires.

10. An electronic textile as defined in claim 1, wherein the electronic structure comprises a counter component configured to store the number of re-uses of the electronic structure.

11. An electronic textile as defined in claim 1, wherein the conductive wires are bare wires.

12. A method of manufacturing an electronic textile, the method comprising the steps of:
providing an electronic structure including conductive wires being at least partly spaced apart from each other and one or more electronic components connected to the conductive wires, wherein one or more gaps are formed in the electronic structure between the at least partly spaced apart conductive wires,
providing a fabric structure including two fabric portions,
sandwiching the electronic structure between the two fabric portions, and
joining the two fabric portions together according to a bonding pattern including bonding segments, such that the bonding segments are arranged in one or more of the gaps of the electronic structure, whereby the electronic structure is held in place in the fabric structure by the bonding pattern, and wherein a bonding strength of the bonding segments is weaker than a tear strength of the fabric portions.

13. A method as defined in claim 12, wherein the step of joining the fabric portions together is made by welding.

14. A method as defined in claim 12, further comprising the steps of arranging the conductive wires in a frame, and cutting the conductive wires out of the frame subsequent to the step of joining the fabric portions together.

* * * * *